United States Patent
Voss (10) Patent No.: US 11,275,136 B2
(45) Date of Patent: Mar. 15, 2022

(54) PASSIVE FLOW DIRECTION BIASING OF CRYOGENIC THERMOSIPHON

(71) Applicant: KONINKLIJKE PHILIPS N.V., Eindhoven (NL)

(72) Inventor: Matthew Voss, Clifton Park, NY (US)

(73) Assignee: Koninklijke Philips N.V., Eindhoven (NL)

( * ) Notice: Subject to any disclaimer, the term of this patent is extended or adjusted under 35 U.S.C. 154(b) by 520 days.

(21) Appl. No.: 16/338,789

(22) PCT Filed: Oct. 4, 2017

(86) PCT No.: PCT/EP2017/075203
§ 371 (c)(1),
(2) Date: Apr. 2, 2019

(87) PCT Pub. No.: WO2018/065458
PCT Pub. Date: Apr. 12, 2018

(65) Prior Publication Data
US 2021/0278491 A1    Sep. 9, 2021

Related U.S. Application Data

(60) Provisional application No. 62/404,907, filed on Oct. 6, 2016.

(51) Int. Cl.
*H01F 6/04*    (2006.01)
*G01R 33/38*    (2006.01)
*F25B 41/20*    (2021.01)
*F25B 9/00*    (2006.01)
(Continued)

(52) U.S. Cl.
CPC .......... *G01R 33/3804* (2013.01); *F25B 9/002* (2013.01); *F25B 9/10* (2013.01); *F25B 41/20* (2021.01); *G01R 33/3815* (2013.01); *H01F 6/04* (2013.01)

(58) Field of Classification Search
CPC ......... G01R 33/3804; H01F 6/04; F25B 9/10; F25B 41/20
See application file for complete search history.

(56) References Cited

U.S. PATENT DOCUMENTS

| 1,329,559 A | 2/1920 | Tesla |
| 6,354,087 B1 | 3/2002 | Nakahara et al. |
| 6,442,949 B1 | 9/2002 | Laskaris et al. |

(Continued)

FOREIGN PATENT DOCUMENTS

| EP | 2734020 A1 | 5/2014 |
| GN | 204730538 U | 10/2015 |
| JP | 20014236 | 1/2001 |

*Primary Examiner* — Ramon M Barrera (57) ABSTRACT

A cooling device (40) includes a heat exchanger (50), a first flow loop (52) connecting a cold sink (42, 44, 46) and the heat exchanger, and a second flow loop (54) connecting a hot sink (20) and the heat exchanger. A first passive one way valve (62) disposed on the first flow loop is oriented to allow flow in an allowed direction of flow ($F_1$) and to block flow in the opposite direction. A second passive one way valve (64) disposed on the second flow loop is oriented to allow flow in an allowed direction of flow ($F_2$) and to block flow in the opposite direction. The allowed directions of flow produce counter-flow in the heat exchanger. In an illustrative embodiment, the hot sink is comprises a cryogenic magnet coil (20) and the hot sink is a cold head (42, 44) and liquid helium tank (46).

21 Claims, 4 Drawing Sheets

(51) Int. Cl.
*F25B 9/10* (2006.01)
*G01R 33/3815* (2006.01)

(56) References Cited

U.S. PATENT DOCUMENTS

| | | |
|---|---|---|
| 7,980,294 B2 | 7/2011 | Ohashi |
| 8,650,877 B1 | 2/2014 | Gustafson |
| 2006/0097146 A1 | 5/2006 | Strobel |
| 2010/0051307 A1 | 3/2010 | Tigwell et al. |
| 2012/0108433 A1 | 5/2012 | Jiang et al. |
| 2013/0160975 A1 | 6/2013 | Stautner et al. |
| 2014/0243205 A1 | 8/2014 | Ackermann et al. |
| 2015/0007586 A1 | 1/2015 | Kraus et al. |
| 2015/0332829 A1 | 11/2015 | Stautner et al. |
| 2016/0276082 A1 | 9/2016 | Ackermann et al. |

PASSIVE FLOW DIRECTION BIASING OF CRYOGENIC THERMOSIPHON

CROSS REFERENCE TO RELATED APPLICATIONS

This application is a U.S. national phase application of International Application No. PCT/EP2017/075203 filed on Oct. 4, 2017, which claims the benefit of U.S. Provisional Application Ser. No. 62/404,907 filed on Oct. 6, 2016 and is incorporated herein by reference.

FIELD

The following relates generally to the cooling arts, cryogenic cooling arts, superconducting magnet arts, the superconducting magnet magnetic resonance imaging (MRI) device arts, and the like.

BACKGROUND

Some commercial magnetic resonance imaging (MRI) devices employ superconducting magnet windings to provide high efficiency generation of the requisite high-strength static ($B_0$) magnetic field. Traditionally, such a magnet is immersed in liquid helium to maintain the superconducting material below its critical superconducting temperature. However, this approach requires a large charge of liquid helium and availability of liquid helium at the time of magnet startup.

Another known approach for cooling a superconducting magnet employs a thermosiphon. The superconducting magnet is disposed in a vacuum dewar to maintain thermal isolation, on a thermally conducting (e.g. copper) substrate that is cooled by way of a cryogenic refrigerator (i.e. cold head) employing helium as the working fluid. More particularly, a cold head cools helium flowing through a primary cooling circuit. A secondary cooling circuit is thermally connected with the primary cooling circuit by way of a heat exchanger. The secondary cooling circuit delivers cooled gas helium to piping that is connected (e.g. brazed or welded) to the copper substrate so as to cool the superconducting windings. Startup can advantageously be performed with only gas helium. As the primary coolant circuit cools the working gas helium, it transitions to a two-phase mixture of gas and liquid helium (LHe), and the LHe collects in a helium tank of the primary cooling circuit. The build-up of a reservoir of LHe in the helium tank provides enhanced temperature stability for the primary circuit during the operational phase. In the secondary cooling circuit, the helium is at a pressure that is low enough so that the helium remains single-phase gas in the secondary coolant circuit thereby promoting passive thermosiphon flow in the secondary cooling circuit. The approach has advantages over more conventional LHe immersion. The thermosiphon approach enables startup without a large supply of LHe.

The following discloses a new and improved systems and methods that address the above referenced issues, and others.

SUMMARY

In one disclosed aspect, a cooling device comprises a heat exchanger, a first flow loop connecting a cold sink and the heat exchanger, and a second flow loop connecting a hot sink and the heat exchanger. A first passive one way valve is disposed on the first flow loop and is oriented to allow flow in an allowed direction of flow in the first flow loop and to block flow in an opposite blocked direction of flow in the first flow loop. A second passive one way valve is disposed on the second flow loop and is oriented to allow flow in an allowed direction of flow in the second flow loop and to block flow in an opposite blocked direction of flow in the second flow loop. The combination of flow in the allowed direction of flow in the first flow loop and flow in the allowed direction of flow in the second flow loop produces counter-flow in the heat exchanger.

In another disclosed aspect, a cooling method is disclosed. First coolant fluid flows through a first flow loop that connects a cold sink and a heat exchanger, and second coolant fluid flow through a second flow loop that connects a hot sink and the heat exchanger. The flowing of the first coolant fluid and the flowing of the second coolant fluid are constrained to produce counter-flow in the heat exchanger by using a first passive one-way valve to allow the flowing of the first coolant fluid in the first flow loop in an allowed direction while blocking flow in an opposite blocked direction; and using a second passive one-way valve to allow the flowing of the second coolant fluid in the second flow loop in an allowed direction while blocking flow in an opposite blocked direction.

In another disclosed aspect, a cryogenic magnet comprises a heat exchanger, a cryogenic cold head, and one or more superconducting magnet windings. A first flow loop connects the cryogenic cold head and the heat exchanger. A second flow loop connects the one or more superconducting magnet windings and the heat exchanger. A first passive one way valve is disposed on the first flow loop and is oriented to allow flow in an allowed direction of flow in the first flow loop and to block flow in an opposite blocked direction of flow in the first flow loop. A second passive one way valve is disposed on the second flow loop and is oriented to allow flow in an allowed direction of flow in the second flow loop and to block flow in an opposite blocked direction of flow in the second flow loop. The combination of flow in the allowed direction of flow in the first flow loop and flow in the allowed direction of flow in the second flow loop produces counter-flow in the heat exchanger.

In another disclosed aspect, a magnetic resonance imaging (MRI) device includes a cryogenic magnet as set forth in the immediately preceding paragraph, arranged to generate a static magnetic field in an examination region, and further includes magnetic field gradient coils arranged to superimpose magnetic field gradients on the static magnetic field in the examination region.

One advantage resides in providing improved and more reliable startup of a thermosiphon cooling system.

Another advantage resides in providing thermosiphon cooling in which flow directions in the primary and secondary coolant circuits are positively controlled to ensure counter-flow in the heat exchanger which promotes efficient heat exchange. This also allows control of flow direction when taking advantage of geometrical placement in a gravity field is not feasible.

Another advantage resides in providing cryogenic thermosiphon cooling with one or more of the foregoing advantages.

Another advantage resides in providing such cryogenic thermosiphon cooling with hermetically sealed primary and secondary cooling circuits.

Another advantage resides in providing cryogenic thermosiphon cooling with one or more of the foregoing advantages and employing helium working fluid.

Another advantage resides in providing a superconducting magnet cooled by cryogenic thermosiphon cooling using helium working fluid, in which the cooling system has one or more of the foregoing advantages.

Another advantage resides in providing a magnetic resonance imaging (MRI) device including a superconducting magnet cooled by cryogenic thermosiphon cooling using helium working fluid, in which the cooling system has one or more of the foregoing advantages.

A given embodiment may provide none, one, two, more, or all of the foregoing advantages, and/or may provide other advantages as will become apparent to one of ordinary skill in the art upon reading and understanding the present disclosure.

BRIEF DESCRIPTION OF THE DRAWINGS

The invention may take form in various components and arrangements of components, and in various steps and arrangements of steps. The drawings are only for purposes of illustrating the preferred embodiments and are not to be construed as limiting the invention. Unless otherwise noted, the drawings are diagrammatic and are not to be construed as being to scale or to illustrate relative dimensions of different components.

FIG. 3 diagrammatically shows a top view of a Tesla valve suitably used as the one-way valves in the cryogenic cooling device of FIG. 1. FIG. 3 also illustrates the two stainless steel blocks with milled Tesla valve conduit patterns that are secured together, e.g. by a brazed joint, to from the Telsa valve.

DETAILED DESCRIPTION

In a heat exchanger, hotter coolant fluid flows in a flow path that is proximate to a flow path carrying cooler coolant fluid, and heat transfers from the hotter coolant fluid to the cooler coolant fluid so as to reduce the temperature of the hotter coolant fluid. In a heat exchanger, the flow of the hotter coolant fluid through its flow path may be parallel to the flow of the cooler coolant fluid through its flow path. Alternatively, the flow of the hotter coolant fluid through its flow path may be anti-parallel to (i.e. in the opposite direction to) the flow of the cooler coolant fluid through its flow path. This latter arrangement is referred to as a counter-flow arrangement, and is more efficient than the parallel flow arrangement because the average temperature difference at points along the parallel flow paths is higher.

A problem recognized herein with existing thermosiphon cooling devices employing primary and secondary coolant circuits connected by a heat exchangers is that such cooling devices generally do not guarantee counter-flow of the primary and secondary coolant in the heat exchanger. Such counter-flow is optimal for efficient heat exchange. The cooling device will still work if the parallel flow (rather than desired counter-flow) is present in the heat exchanger, but the heat transfer efficiency will be substantially reduced as compared with the desired counter-flow arrangement.

The problem can be understood as follows. For a symmetric thermosiphon design of arbitrary orientation respective to gravity, there is no inherent preferential direction of flow in the primary and secondary coolant circuits. Such a preferential direction is typically designed into the thermosiphon by arranging one of the vertical legs of the loop to be a hot or cold sink. However, the geometry of a given system layout may not permit this. Viewed more generally, the flow direction is determined on initial startup of the thermosiphon action by the overall resistance to flow in one direction versus the other, so that a vertical leg or other layout design configuration may be insufficient to reliably instill the desired flow direction in the loop.

A further difficulty is that the direction of flow in the coolant loops may be difficult or impossible to determine externally. An undesirable parallel flow might be detected by recognizing a reduced cooling efficiency due to the lack of counter-flow. However, this requires performance analysis by an expert who is knowledgeable about the practically achievable cooling efficiency, and who has the tools and skill to measure this efficiency. Moreover, even if a reduced cooling efficiency is recognized, the non-optimal efficiency could be caused by any of a number of factors (e.g. leakage of coolant fluid from one or both cooling loops, compromised thermal insulation, or so forth), so that further investigation is required to isolate undesired parallel flow as the culprit. Furthermore, if an undesired parallel flow is introduced at the time of startup of the thermosiphon cooling device, this is not detectable until the cooling device reaches its final operational state.

In embodiments disclosed herein, a passive one way valve is included in at least the secondary coolant circuit, and preferably also in the primary coolant circuit, in order to ensure the desired flow direction to provide counter-flow in the heat exchanger. In general, any type of check valve or non-return valve may be used as the passive one way valve.

In some illustrative embodiments disclosed herein, a thermosiphon cooling device is disclosed in the context of providing cooling for a superconducting magnet of a magnetic resonance imaging (MRI) device. These are merely illustrative embodiments, and the disclosed thermosiphon cooling devices will find application in diverse applications.

Figure 1:
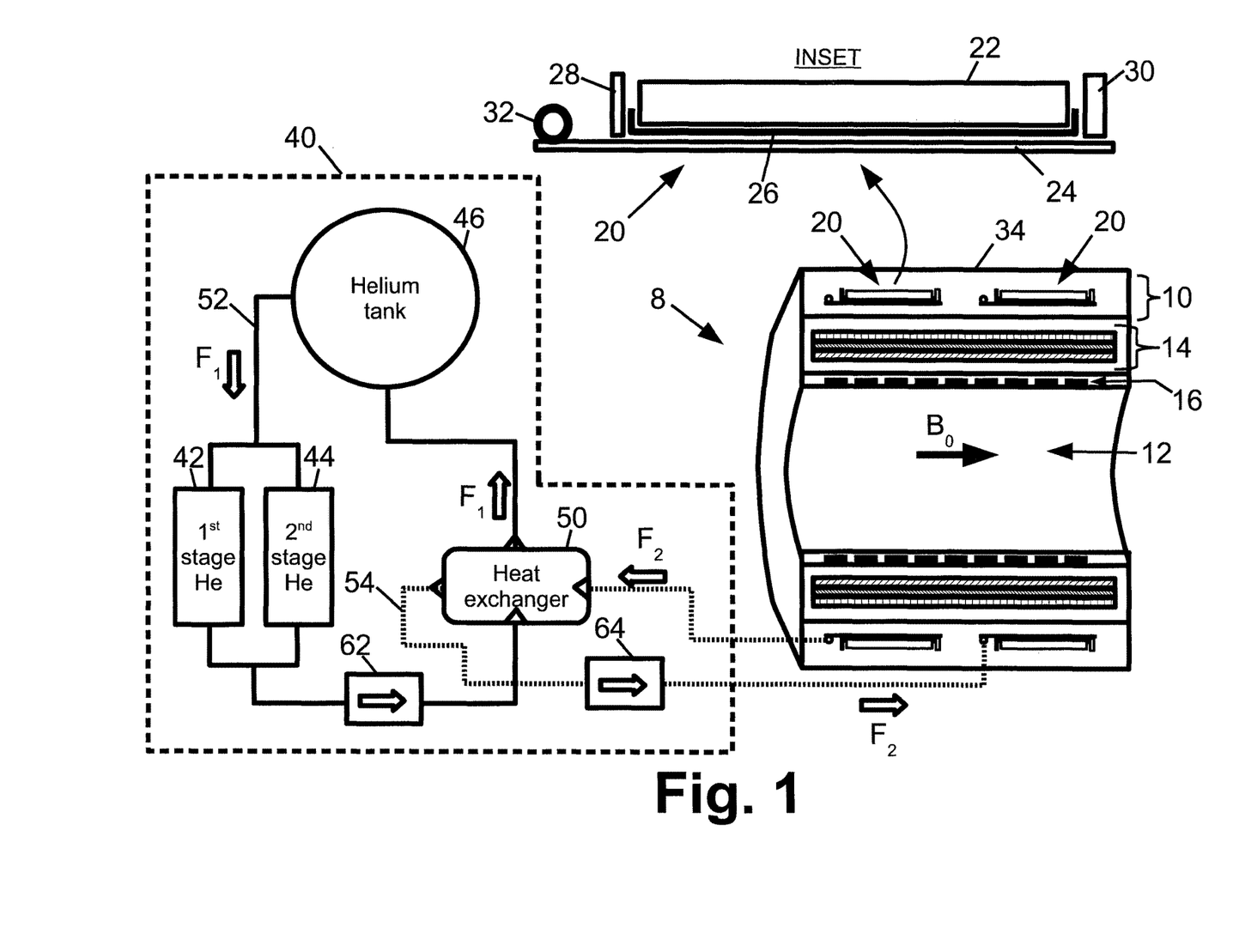
FIG. 1 diagrammatically shows a magnetic resonance imaging (MRI) device including a superconducting magnet cooled by a cryogenic cooling device using helium working fluid. The Inset shows an enlarged cross-sectional view of a portion of one superconducting magnet coil.

With reference to FIG. 1, an illustrative magnetic resonance imaging (MRI) device 8 includes a superconducting magnet 10, which in the illustrative embodiment is a horizontal solenoidal superconducting magnet 10 defining a horizontal bore 12 into which a patient or other imaging subject is inserted for MRI examination. A couch or other patient support (not shown) may be provided for loading the patient. The MRI device 8 further includes, in addition to the superconducting magnet 10, other components known in the MRI arts such as resistive magnetic field gradient coils 14, a whole-body radio frequency (RF) coil 16 (and/or one or more local RF coils, not shown), and so forth. These components are used in known ways to acquire MRI images. For example, in one illustrative imaging sequence, the operating superconducting magnet 10 produces a static ($B_0$) magnetic field in an examination region within the bore 12. In some embodiments, the magnitude $|B_0|$ of this field may be 1.5 Tesla, 3.0 Tesla, 7.0 Tesla, or so forth. The $B_0$ magnetic field (statistically) orients nuclear spins, which are excited by RF pulses applied by the RF coil 16. The excited magnetic resonance is spatially limited and/or phase- and/or frequency-encoded by magnetic field gradients superimposed on the static ($B_0$) magnetic field in the examination region by the magnetic field gradient coils 14, and the thusly manipulated excited magnetic resonance are detected by the RF coil 16 to generate MRI imaging data. An image reconstruction algorithm suitable for the chosen spatial encoding may be applied to reconstruct an MRI image from the acquired MRI imaging data.

With continuing reference to FIG. 1, a portion of one coil 20 of the superconducting magnet 10 is shown in greater detail in the Inset. Superconducting windings 22 (diagrammatically shown as a box but typically comprising one or multiple winding layers) are wrapped around an annular thermally conductive former 24, such as a copper or copper alloy hoop or ring that encircles the bore 12. If the former 24 is electrically conductive (which is the case for copper/copper alloy), then a thermally conductive but electrically insulating spacer 26 may be provided, for example one or more fiberglass sheets, provides electrical isolation of the superconducting windings 22 from the former 24. Likewise, an inner insulating ring (not shown) may be provided at the inside diameter (ID) of the copper alloy substrate loop 24. Insulator elements 28, 30 may optionally be provided at the ends for positioning or other purposes. A pipe 32 which is part of the secondary coolant circuit (to be described) is brazed, welded, or otherwise secured with the copper alloy substrate loop 24, so that the substrate 24 and the supported superconducting conductor windings 22 are heat sinked by the secondary coolant circuit via the secured pipe 32.

With reference back to the main drawing of FIG. 1, an illustrative two or (typically) more such magnet winding coils 20 is disposed in an evacuated dewar 34 to provide thermal isolation for the cooled assembly including the superconducting windings 22 and thermally conductive substrate hoop 24. As is known in the art, more commonly a number of such winding coils 20 of different sizes, number of coil windings, or so forth are positioned in accord with a magnet design to produce the static ($B_0$) magnetic field with a high degree of spatial uniformity in an examination region within the bore 12.

Figure 2:
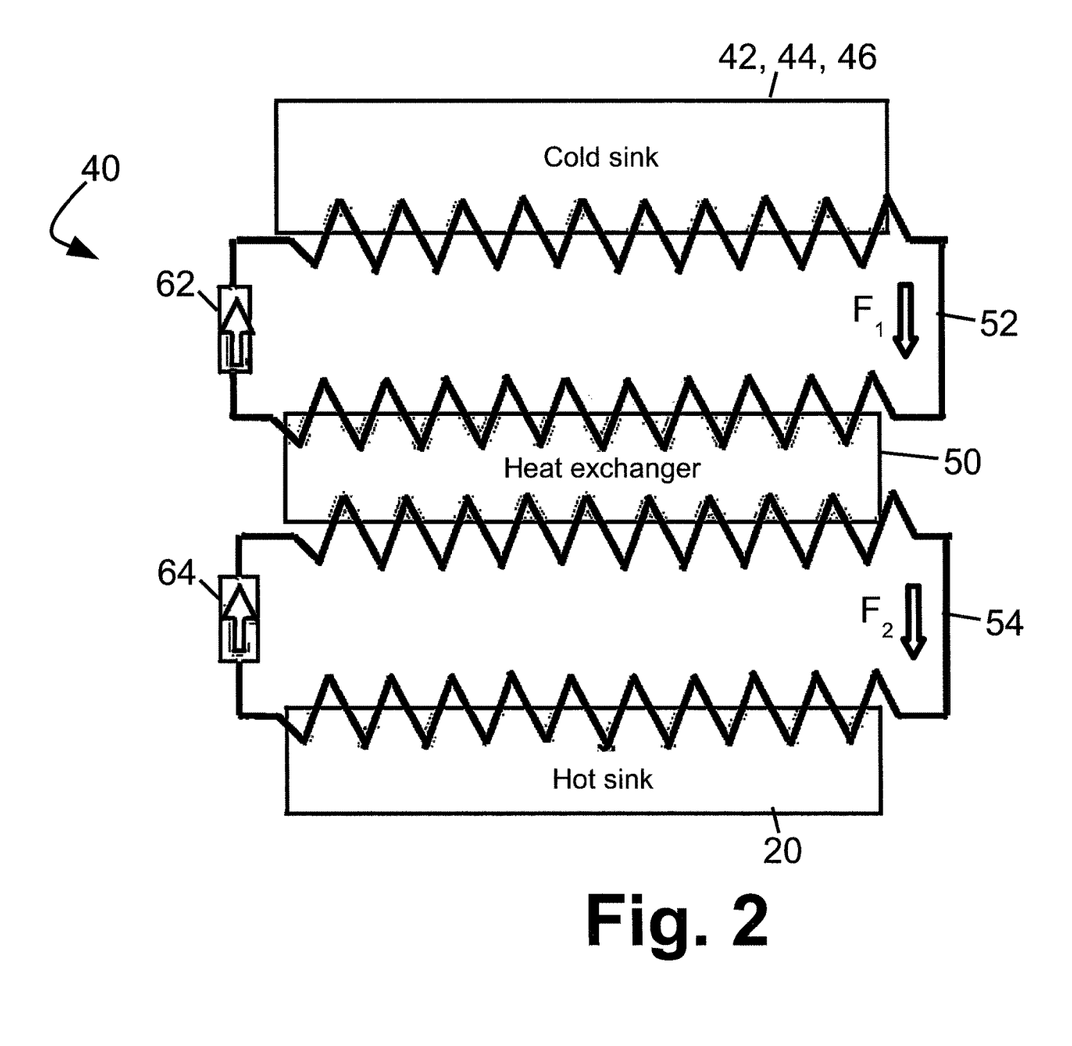
FIG. 2 diagrammatically shows the cryogenic cooling device of claim 1.

With continuing reference to FIG. 1 and with further reference to FIG. 2, the magnet winding coils 20 are cooled by a cryogenic cooling device 40. FIG. 2 shows the cooling device 40 in a diagrammatic fashion. A diagrammatically indicated cold head 42, 44 includes a first stage helium cold station 42 and a second stage helium cold station 44. The cold head 42, 44 may be embodied by any cryogenic refrigerator operable to cool helium working fluid. While two cold stations are shown, the number of cold stations could instead be one or could be more than two. In a typical configuration, the first cold station 42 is at a higher temperature than the second cold station 44, but other configurations are possible. The cold head 42, 44 typically operates by a piston or the like (not shown) providing for cyclic compression and expansion of the working fluid (e.g. helium) to implement a thermodynamic cycle by which the working fluid is cooled. In some embodiments, operation of the cold head 42, 44 is effective to liquefy helium gas to generate liquid helium (LHe) or a two-phase mixture of helium gas and LHe. This is the case in the illustrative embodiment of FIG. 1, in which a helium tank 46 serves as a vapor-liquid separator, with the LHe collecting at the bottom of the helium tank 46 and the balance of the volume of the helium tank 46 being filled by helium gas.

The cryogenic cooling device 40 further includes a heat exchanger 50. A first flow loop 52 connects a cold sink with the heat exchanger 50. A second flow loop 54 connects a hot sink with the heat exchanger 50. In the specific illustrative example, the cold sink comprises the cold head 42, 44 and the helium tank 46, while the hot sink comprises the one or more magnet coils 20. More generally, however, the cold sink and the hot sink may be any masses connected with the heat exchanger 50 by respective first and second flow loops 52, 54 in which the cold sink is at a lower temperature than the hot sink. For cryogenic cooling devices, the cold sink is also at a temperature that is below room temperature. For illustrative clarity, in FIG. 1 the first flow loop 52 is drawn using solid lines while the second flow loop 54 is drawn using dotted lines.

The heat exchanger 50 may employ any configuration that brings the flow in the first flow loop 52 and the flow in the second flow loop 54 into sufficient proximity to enable suitably efficient heat transfer from the warmer coolant fluid flowing in the second flow loop 54 to the colder coolant fluid flowing in the first flow loop 52. For example, the heat exchanger may have a shell-and-tube configuration (not shown) in which one coolant fluid flows in tubes contained in a surrounding shell through which the other coolant fluid flows. For maximum heat transfer efficiency a counter-flow arrangement should be implemented in which flow in the pipes is in the opposite direction from flow in the shell. More generally, the specific layout of the heat exchanger defines a counter-flow arrangement which is diagrammatically indicated in the heat exchanger of FIG. 1 by triangular flow direction indicators.

As previously discussed, the appropriate flow directions in the first flow loop 52 and the second flow loop 54 can be established by appropriate layout of the loops. However, there are disadvantages to this approach as disclosed elsewhere herein. In the embodiments disclosed herein, passive one-way valves 62, 64 are provided to ensure the appropriate flow directions to achieve counter-flow in the heat exchanger 50. More particularly, a first passive one-way valve 62 is disposed on the first flow loop 52, and is oriented to allow flow in an allowed direction of flow $F_1$ in the first flow loop 52 and to block flow in an opposite blocked direction of flow in the first flow loop 52. Likewise, the second passive one-way valve 64 is disposed on the second flow loop 54, and is oriented to allow flow in an allowed direction of flow $F_2$ in the second flow loop 54 and to block flow in an opposite blocked direction of flow in the second flow loop 54. The orientations of the passive one-way valves 62, 64 are chosen so that the combination of flow in the allowed direction of flow $F_1$ in the first flow loop 52 and flow in the allowed direction of flow $F_2$ in the second flow loop 54 produces counter-flow in the heat exchanger 50. The two passive one-way valves 62, 64 provide positive assurance that the flow directions that are established in the two flow loops 52, 54 are oriented correctly to provide counter-flow in the heat exchanger 50.

By way of a more specific example directed to cooling of the superconducting magnet coils 20, the first flow loop 52 contains helium fluid as the working fluid (i.e. as the coolant fluid). The helium fluid in the first flow loop 52 is maintained at an elevated pressure, e.g. initially above 2000 psi in some embodiments. Initially, this helium fluid is single-phase helium gas; however, as the cold head operates to cool the helium gas the colder station 44 eventually reaches the temperature at which the helium at the pressure of the first flow loop 52 begins to liquefy (e.g. typically around 3 K to 4 K dependent on pressure), leading to the helium fluid in the first flow loop 52 transitioning to a two-phase mixture of helium gas and liquid helium (LHe). The helium tank 46 acts as a vapor-liquid separator, with the LHe collecting at the bottom of the tank 46 and providing a coolant reservoir to maintain the helium fluid in the first flow loop 52 at cryogenic temperature and delay magnet quenching in the event of temporary loss of power to the cold head 42, 44.

The pressure in the first flow loop 52 also decreases during cooldown, to a pressure on the order of a few psi (e.g., about 8 psi in some embodiments) as the helium is partially liquefied in the final operational state.

The second flow loop 54 also contains helium fluid as the working fluid (i.e. coolant fluid); however, the helium fluid in the second flow loop 54 remains in the gas phase throughout the cooldown (this ensures that thermal siphon flow is maintained throughout the cooldown) and is hence referred to herein as helium gas. In a typical embodiment, the helium gas in the second flow loop 54 is initially at a few hundred psi, and eventually cools down to a temperature of around 3 K to 4 K, i.e. comparable to (though slightly above) the temperature of the helium fluid in the first flow loop 52. In some illustrative embodiments, in the operational state the helium gas in the second flow loop 54 is also at a pressure of a few psi in the final operational state.

As noted above, flow in the second flow loop 54 is due to thermosiphon action, and no mechanical pump is connected to drive flow in the second flow loop 54. Flow in the first flow loop 52 is driven by natural circulation due to cooling action of the cold head 42, 44. The passive one-way valves 62, 64 are also preferably passive devices. Accordingly, the cryogenic cooling device 40 is advantageously entirely passive except for electromechanical input to drive the piston or other mechanism of the cold head 42, 44. Moreover, due to the flow direction biasing provided by the passive one-way valves 62, 64, the components of the cooling device 40 and the spatial layout of the flow loops 52, 54 can advantageously be arranged in any fashion, without the need to provide gravitational flow biasing by judicious arrangement of these components and layout of the flow loops.

Figure 3:
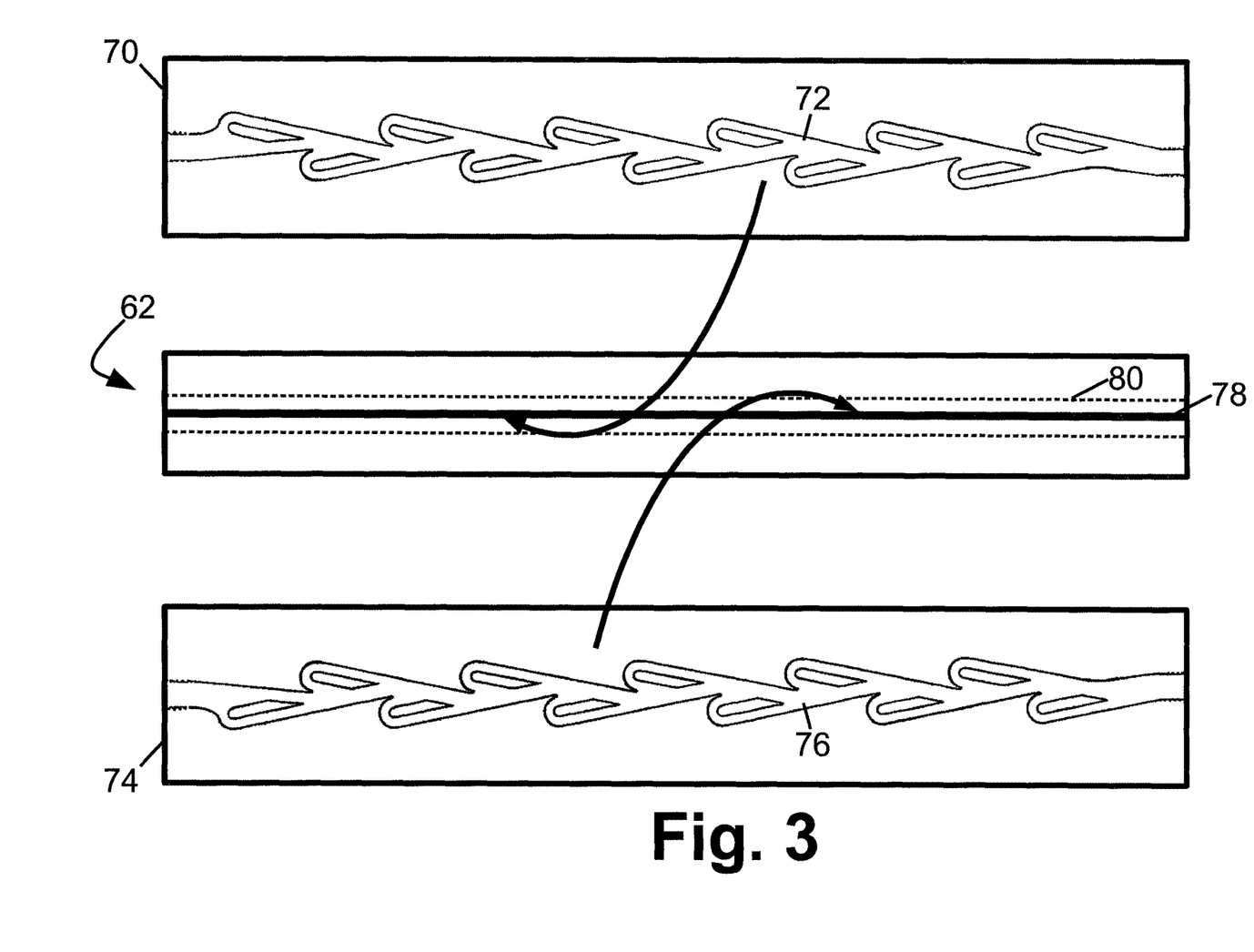

With reference to FIG. 3, an illustrative embodiment of the passive one-way valves 62, 64 is described. In this illustrative embodiment, each passive one-way valve is a Tesla valve. See, e.g. Nikola Tesla, U.S. Pat. No. 1,329,559 (issued Feb. 3, 1920). FIG. 3 illustrates one-way valve 62 by way of illustrative example, but the other one-way valve 64 can have the same construction. The illustrative Tesla valve 62 comprises a first stainless steel block 70 having a milled Tesla valve conduit pattern 72, and a second stainless steel block 74 having a milled Tesla valve conduit pattern 76. The first and second stainless steel blocks 70, 74 hermetically sealed together, for example by brazing to form a brazed joint 78, with the Tesla valve conduit patterns 72, 76 of the first and second stainless steel blocks 70, 74 defining a Tesla valve conduit 80 (hidden feature shown by dashed lines in the assembled one-way valve 62 of FIG. 3) passing though the hermetically sealed first and second stainless steel blocks forming the one-way valve 62.

As described in greater detail in U.S. Pat. No. 1,329,559 which is incorporated herein by reference in its entirety, the Tesla valve conduit presents a relatively unimpeded path for fluid flow in the allowed flow direction (the direction from left to right in FIG. 3), while presenting a tortuous flow path for fluid flow in the blocked flow direction (the direction from right to left in FIG. 3). The manufacturing approach disclosed herein provides the Tesla valve with the brazed joint 78 having a large contact area so as to provide hermetic sealing of the Tesla valve conduit 80 which has negligible leakage even for low molecular density helium working fluid. While brazing of stainless steel blocks 70, 74 having milled Tesla conduit patterns 72, 76 is a preferred approach, other machining techniques can be used to form the Tesla conduit patterns 72, 76 and/or to join the two blocks 70, 74 to form the joint 78.

The Tesla valve is well-suited for use as the passive one-way valves 62, 64 of the cryogenic cooling device 40 because these valves 62, 64 are not required to have very high differential resistance in the allowed flow direction versus the blocked flow direction. As previously noted, the flow directions in the respective first and second flow loops 52, 54 are determined on initial startup by the overall resistance to flow in one direction versus the other. Thus, the passive one-way valve 62 need only have sufficient directional bias to ensure that overall flow resistance of the first flow loop 52 in the allowed direction $F_1$ is lower than the flow resistance in the opposite direction. Likewise, the passive one-way valve 64 need only have sufficient directional bias to ensure that overall flow resistance of the second flow loop 54 in the allowed direction $F_2$ is lower than the flow resistance in the opposite direction. The Tesla valve is readily capable of providing this level of directional bias.

Figure 4:
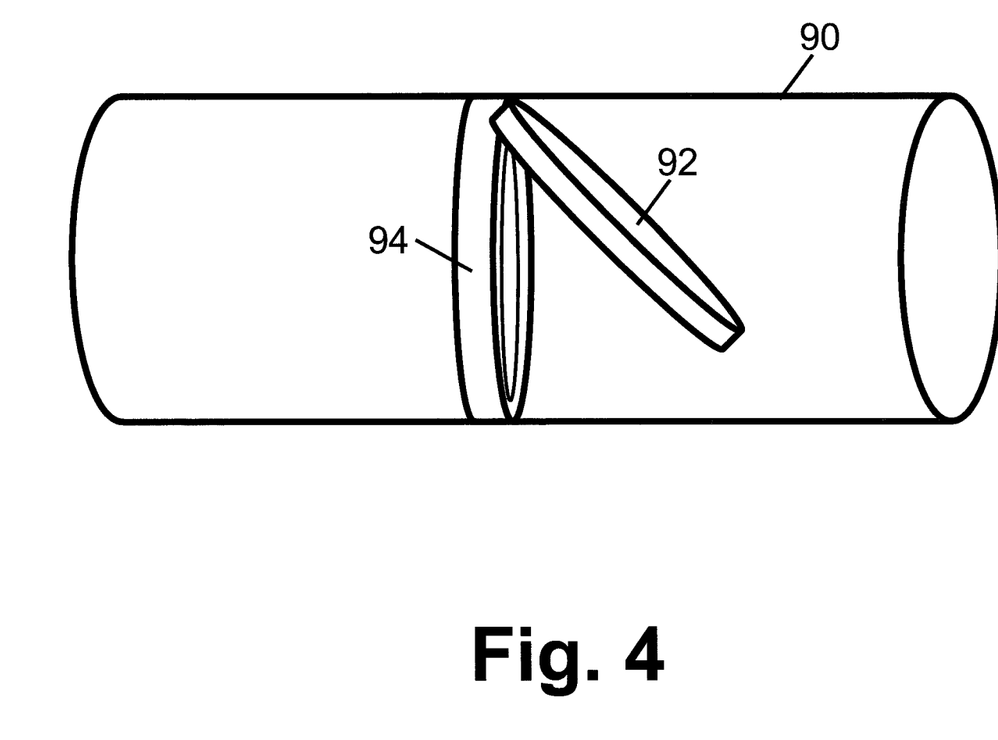
FIG. 4 diagrammatically shows an alternative one-way valve.

With reference to FIG. 4, although a Tesla valve is a preferred embodiment of the passive one-way valves 62, 64 of the cryogenic cooling device 40, more generally any type of one-way valve may be used. FIG. 4 presents an alternative passive one way valve embodiment of the flap check valve design, in which a valve body 90 (e.g. a short length of pipe or tubing) defines the flow path through the flap check valve, and a hinged valve flap 92 mates with a valve seat 94 so that the valve flap 92 can move away from the valve seat 94 only in one direction (to the right in FIG. 4) to allow flow in the allowed direction (from left to right in FIG. 4); whereas, flow in the blocked direction (from right to left in FIG. 4) firmly presses the valve flap 92 into the valve seat 94 to block the flow. While such a valve is suitable for use as the passive one-way valves 62, 64, it has certain disadvantages, such as the potential for freeze-up of the hinge at cryogenic temperature if the working fluid contains residual water content.

While described in the context of the cryogenic cooling device 40 operating with helium working fluid, it will be appreciated that the disclosed improvements may more generally be employed in any cryogenic cooling device, e.g. also in one employing liquid nitrogen, air, chilled water, or another working fluid. The disclosed improvements may even more generally comprise any thermosiphon cooling device including a heat exchanger and first and second flow loops with passive one way valves oriented to ensure a combination of flow in allowed directions in the respective first and second flow loops that produces counter-flow in the heat exchanger.

In the illustrative embodiments, e.g. FIG. 2, the heat exchanger 50 is a single-stage heat exchanger in which the flows F1, F2 are directly thermally coupled. In other embodiments, it is contemplated for the heat exchanger to be a multi-stage heat exchanger in which at least one intermediate flow (FI, not shown) is thermally coupled with the flow F1 and with the flow flow F2 so as to indirectly transfer heat in two stages (F2→FI→F1). When employing such a multi-stage heat exchanger, the one-way valves 62, 64 are still advantageously employed to establish the correct flow directions to establish counter-flow of flows F1, F2 in the (multi-stage) heat exchanger; and additionally, a third one-way valve (now shown) is preferably included to establish the correct flow direction for the counter flow in the intermediate FI fluid loop.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof.

The invention claimed is:

1. A cooling device comprising:
   a heat exchanger;
   a first flow loop connecting a cold sink and the heat exchanger;
   a second flow loop connecting a hot sink and the heat exchanger;
   a first passive one-way valve disposed on the first flow loop and oriented to allow flow in an allowed direction of flow ($F_1$) in the first flow loop and to block flow in an opposite blocked direction of flow in the first flow loop; and
   a second passive one-way valve disposed on the second flow loop and oriented to allow flow in an allowed direction of flow ($F_2$) in the second flow loop and to block flow in an opposite blocked direction of flow in the second flow loop;
   wherein the combination of flow in the allowed direction of flow in the first flow loop and flow in the allowed direction of flow in the second flow loop produces counter-flow in the heat exchanger.

2. The cooling device of claim 1 wherein the first passive one-way valve comprises a first Tesla valve and the second passive one-way valve comprises a second Tesla valve.

3. The cooling device of claim 2 wherein the first Tesla valve and the second Tesla valve each comprises:
   a first stainless steel block having a milled Tesla valve conduit pattern;
   a second stainless steel block having a milled Tesla valve conduit pattern;
   the first and second stainless steel blocks hermetically sealed together with the Tesla valve conduit patterns of the first and second stainless steel blocks defining a Tesla valve conduit (80) passing though the hermetically sealed first and second stainless steel blocks.

4. The cooling device of claim 3 wherein the first and second stainless steel blocks of each Tesla valve are hermetically sealed together by a brazed joint.

5. The cooling device of claim 1 further comprising:
   helium fluid disposed in the first flow loop; and
   helium gas disposed in the second flow loop.

6. The cooling device of claim 1 wherein no mechanical pump is connected to drive flow in the second flow loop.

7. The cooling device of claim 1 further comprising:
   a superconducting magnet winding, the hot sink comprising the superconducting magnet winding; and
   a cryogenic cold head, the cold sink comprising the cryogenic cold head.

8. The cooling device of claim 7 further comprising:
   a vapor-liquid phase separator, the cold sink further comprising the vapor-liquid phase separator.

9. A magnetic resonance imaging (MRI) device comprising:
   a magnet comprising one or more superconducting magnet windings;
   a cryogenic cold head; and
   the cooling device of claim 1 wherein the hot sink of the cooling device comprises the one or more superconducting magnet windings and the cold sink of the cooling device comprises the cryogenic cold head and a liquid helium tank.

10. A cooling method comprising:
    flowing first coolant fluid through a first flow loop that connect a cold sink and a heat exchanger;
    flowing second coolant fluid through a second flow loop that connects a hot sink and the heat exchanger; and
    constraining the flowing of the first coolant fluid and the flowing of the second coolant fluid to produce counter-flow in the heat exchanger by:
       using a first passive one-way valve to allow the flowing of the first coolant fluid in the first flow loop in an allowed direction ($F_1$) while blocking flow in an opposite blocked direction, and
       using a second passive one-way valve to allow the flowing of the second coolant fluid in the second flow loop in an allowed direction ($F_2$) while blocking flow in an opposite blocked direction.

11. The cooling method of claim 10 wherein the first passive one-way valve comprises a first Tesla valve and the second passive one-way valve comprises a second Tesla valve.

12. The cooling method of claim 11 further comprising constructing each of the first Tesla valve and the second Tesla valve by:
    milling a Tesla valve conduit pattern in a first stainless steel block;
    milling a Tesla valve conduit pattern in a second stainless steel block; and
    hermetically sealing the first and second stainless steel blocks together with the Tesla valve conduit patterns of the first and second stainless steel blocks arranged to define a Tesla valve conduit passing though the hermetically sealed first and second stainless steel blocks.

13. The cooling method of claim 12 wherein the hermetically sealing comprises brazing the first and second stainless steel blocks together.

14. The cooling method of claim 10 wherein the first coolant fluid is helium fluid and the second coolant fluid is helium gas.

15. The cooling method of claim 14 further comprising:
    collecting a liquid helium phase of the helium fluid flowing through the first flow loop in a helium tank connected with the first flow loop.

16. A cryogenic magnet comprising:
    a heat exchanger;
    a cryogenic cold head;
    one or more superconducting magnet windings;
    a first flow loop connecting the cryogenic cold head and the heat exchanger;
    a second flow loop connecting the one or more superconducting magnet windings and the heat exchanger;
    a first passive one-way valve disposed on the first flow loop and oriented to allow flow in an allowed direction of flow ($F_1$) in the first flow loop and to block flow in an opposite blocked direction of flow in the first flow loop; and
    a second passive one-way valve disposed on the second flow loop and oriented to allow flow in an allowed direction of flow ($F_2$) in the second flow loop and to block flow in an opposite blocked direction of flow in the second flow loop;
    wherein the combination of flow in the allowed direction of flow in the first flow loop and flow in the allowed direction of flow in the second flow loop produces counter-flow in the heat exchanger.

17. The cryogenic magnet of claim 16 wherein the first passive one-way valve comprises a first Tesla valve and the second passive one-way valve comprises a second Tesla valve.

18. The cryogenic magnet of claim 16 further comprising:
    helium fluid disposed in the first flow loop and flowing in the allowed direction of flow ($F_1$) in the first flow loop; and helium gas disposed in the second flow loop and flowing in the allowed direction of flow ($F_2$) in the second flow loop.

19. The cryogenic magnet of claim 18 wherein the helium fluid disposed in the first flow loop is one of helium gas, liquid helium, and a two-phase mixture of helium gas and liquid helium.

20. The cryogenic magnet of claim 16 further comprising:
a vapor-liquid separator connected with the first flow loop.

21. A magnetic resonance imaging (MRI) device comprising:
a cryogenic magnet as set forth in claim 16 arranged to generate a static magnetic field in an examination region; and
magnetic field gradient coils arranged to superimpose magnetic field gradients on the static magnetic field in the examination region.

* * * * *